United States Patent
Keller et al.

(10) Patent No.: US 7,073,152 B2
(45) Date of Patent: Jul. 4, 2006

(54) SYSTEM AND METHOD FOR DETERMINING A HIGHEST LEVEL SIGNAL NAME IN A HIERARCHICAL VLSI DESIGN

(75) Inventors: S. Brandon Keller, Evans, CO (US); Gregory Dennis Rogers, Fort Collins, CO (US); George Harold Robbert, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 287 days.

(21) Appl. No.: 10/647,768

(22) Filed: Aug. 25, 2003

(65) Prior Publication Data

US 2005/0050488 A1   Mar. 3, 2005

(51) Int. Cl.
*G06F 17/50* (2006.01)

(52) U.S. Cl. ........................................................ 716/12
(58) Field of Classification Search ................ 716/8, 716/12–14
See application file for complete search history.

(56) References Cited

U.S. PATENT DOCUMENTS

| | | | | |
|---|---|---|---|---|
| 5,249,133 A | * | 9/1993 | Batra | 716/5 |
| 5,301,318 A | * | 4/1994 | Mittal | 716/11 |
| 5,946,218 A | | 8/1999 | Taylor et al. | |
| 5,949,691 A | | 9/1999 | Kurosaka et al. | |
| 6,185,722 B1 | | 2/2001 | Darden et al. | |
| 6,272,671 B1 | * | 8/2001 | Fakhry | 716/18 |
| 6,378,123 B1 | * | 4/2002 | Dupenloup | 716/18 |
| 6,490,717 B1 | | 12/2002 | Pedersen et al. | |
| 6,493,864 B1 | | 12/2002 | Liu | |
| 6,531,923 B1 | | 3/2003 | Burns | |
| 6,598,211 B1 | * | 7/2003 | Zachariah et al. | 716/4 |
| 6,751,782 B1 | | 6/2004 | Levin et al. | |
| 6,801,884 B1 | | 10/2004 | Ferreri et al. | |
| 6,836,877 B1 | * | 12/2004 | Dupenloup | 716/18 |
| 2002/0144219 A1 | * | 10/2002 | Zachariah et al. | 716/4 |
| 2003/0200519 A1 | * | 10/2003 | Argyres | 716/6 |
| 2003/0208721 A1 | * | 11/2003 | Regnier | 716/1 |
| 2003/0221173 A1 | | 11/2003 | Fisher | |

FOREIGN PATENT DOCUMENTS

JP          07334532 A          12/1995

OTHER PUBLICATIONS

Keller, S. Brandon; Rogers, Dennis R.; Lelm, Charles A.; U.S. Appl. No. 10/706,682, Entitled: Method And Program Product For Determining Nets Requiring Detailed Electromigration And Self Heating Analysis In A Digital Integrated Circuit; Filed Nov. 12, 2003.

(Continued)

Primary Examiner—Stacy A. Whitmore

(57) ABSTRACT

Systems, methods, and software products determine a highest level signal name in a hierarchical circuit design. A signal path is traced into a hierarchically lower level of the circuit design from a predetermined net in the circuit design to a predetermined terminal instance, while adding indicia, to an instance history list, of each subsequent instance encountered. A port instance is determined on the terminal instance associated with a selected net for which the highest level signal name is to be determined. The selected net is designated as the current net. For each stored indicia in the instance history list, the net connected to the current net in a hierarchical parent of the instance identified by the indicia is determined, to establish a next current net. If a condition exists wherein there is no connection from the current net to a hierarchically higher level instance, then the current net is established as the highest level signal name for the selected net.

15 Claims, 5 Drawing Sheets

OTHER PUBLICATIONS

Keller, S. Brandon; Rogers, Dennis R.; Lelm, Charles A.; U.S. Appl. No. 10/706,698, Entitled: Method And Program Product For Performing Self–Heating Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,376, Entitled: Method And Program For Visual Display and One–Click Repair Of Electromigration And Self Heating Design–Rule Violations In A Digital Integrated Circuit Layout Database; Filed Nov. 12, 2003.

Keller, S. Brandon; Rogers, Dennis R.; Lelm, Charles A.; U.S. Appl. No. 10/706,501, Entitled: Method And Program Product For Performing Electromigration Analysis In A Digital Integrated Circuit By Converting A Netlist To A DC Model And Performing DC Analysis Of The DC Model; Filed Nov. 12, 2003.

Keller, S. Brandon; Rogers, Dennis R.; Lelm, Charles A.; U.S. Appl. No. 10/706,528, Entitled: Method And Program Product For Performing A Worst Case Electromigration And Self–Heating Analysis In A Digital Integrated Circuit With Worst–Case Superposition Of Partial Currents; Filed Nov. 12, 2003.

Keller, S. Brandon; Rogers, Dennis R.; Lelm, Charles A.; U.S. Appl. No. 10/706,692, Entitled: Method And Program Product For Performing Electromigration Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,508, Entitled: Method And Program Product For Performing Self–Heating Analysis In A Digital Integrated Circuit Layout Database by Substituting Resistive Models For Active Devices; Filed Nov. 12, 2003.

Keller, S. Brandon; Rogers, Dennis R.; Robberts, George H.; U.S. Patent Application filed under EV210655516US; Entitled: Method And Program Product For Determining Worst Case Currents In A Digital Integrated Circuit Through Worst–Case Superposition Of Partial Currents; Filed Jan. 30, 2004.

Keller, S. Brandon; Rogers, Dennis R.; Robberts, George H.; U.S. Patent Application filed under EV210655564US; Entitled: Systems And Methods For Re–Using Circuit Design Analysis Results; Filed Jan. 30, 2004.

Keller, S. Brandon; Rogers, Dennis R.; Robberts, George H.; U.S. Patent Application filed under EV210655581US; Entitled: System And Method For Determining Detail Of Analysis In A Circuit Design; Filed Jan. 30, 2004.

Keller, S. Brandon; Rogers, Dennis R.; Robberts, George H.; U.S. Patent Application filed under EV210655595US; Entitled: Systems And Methods That Identify Equivalent Instantiation–Specific Configuration Information For Analysis Tools; Filed Jan. 30, 2004.

Keller, S. Brandon; Rogers, Dennis R.; Robberts, George H. & Stevens, Scott Alan; U.S. Patent Application filed under EV210655520US; Entitled: System And Method To Limit Analyzed Current Flow In A Circuit Design; Filed Jan. 30, 2004.

Keller, S. Brandon; Rogers, Dennis R.; Robberts, George H.; U.S. Patent Application filed under EV210655533US; Entitled: System And Method For Processing Configuration Information; Filed Jan. 30, 2004.

Keller, S. Brandon; Rogers, Dennis R.; Robberts, George H.; U.S. Patent Application filed under EV210655555US; Entitled: System And Method For Balancing Run–Time And Result Accuracy In A Circuit Design Analysis Tool; Filed Jan. 30, 2004.

Keller, S. Brandon; Rogers, Dennis R.; Robberts, George H.; U.S. Patent Application filed under EV210655578US; Entitled: System And Method For Indicating Logic State Combinations Used During Circuit Design Analysis; Filed Jan. 30, 2004.

Keller, S. Brandon; Rogers, Dennis R.; Robberts, George H.; U.S. Patent Application filed under EV210655547US; Entitled: System And Method For Determining Control Signal Combinations For Use During Simulation Of A Stage Of A Circuit Design; Filed Jan. 30, 2004.

* cited by examiner

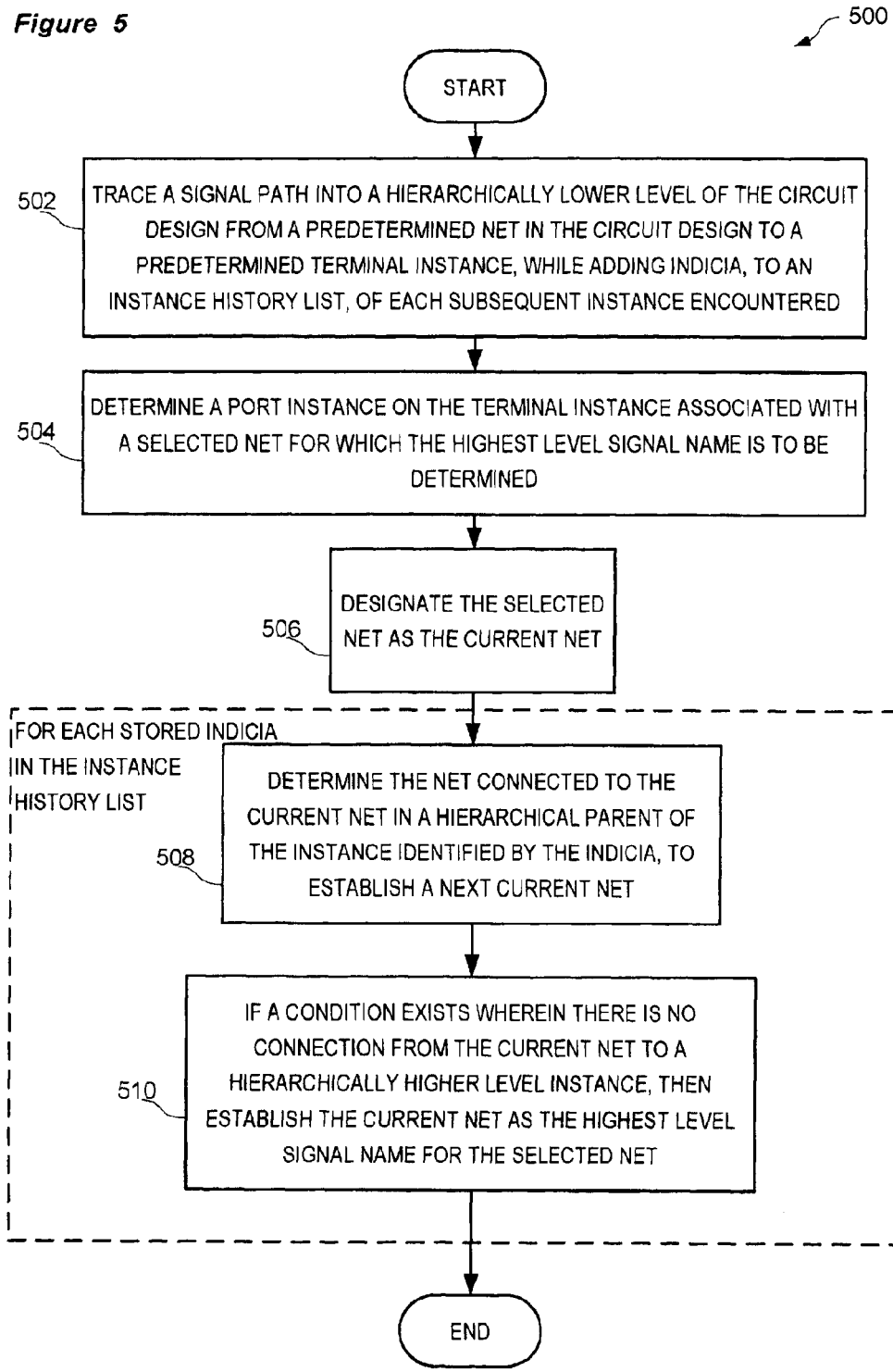

US 7,073,152 B2

SYSTEM AND METHOD FOR DETERMINING A HIGHEST LEVEL SIGNAL NAME IN A HIERARCHICAL VLSI DESIGN

RELATED APPLICATIONS

The present document contains material related to the material of copending, cofiled, U.S. patent application Ser. No. 10/647,597, entitled System And Method For Determining Wire Capacitance For A VLSI Circuit; Ser. No. 10/647,595, entitled System And Method For Determining Applicable Configuration Information For Use In Analysis Of A Computer Aided Design; Ser. No. 10/647,687, entitled Systems And Methods Utilizing Fast Analysis Information During Detailed Analysis Of A Circuit Design; Ser. No. 10/647,594, entitled Systems And Methods For Determining Activity Factors Of A Circuit Design; Ser. No. 10/647,606, entitled System And Method For Determining Connectivity Of Nets In A Hierarchical Circuit Design; Ser. No. 10/647,596, entitled System And Method Analyzing Design Elements In Computer Aided Design Tools; Ser. No. 10/647,608, entitled System And Method For Determining Unmatched DEsign Elements In A Computer-Automated Design; Ser. No. 10/647,598, entitled Computer Aided Design Systems And Methods With Reduced Memory Utilization; Ser. No. 10/647,688, entitled System And Method For Iteratively Traversing A Hierarchial Circuit Design; Ser. No. 10/647,769, entitled Systems And Methods For Establishing Data Model Consistency Of Computer Aided Design Tools; Ser. No. 10/647,607, entitled Systems And Methods For Identifying Data Sources Associated With A circuit Design; and Ser. No. 10/647,605, entitled Systems And Methods For Performing Circuit Analysis On A Circuit Design, the disclosures of which are hereby incorporated herein by reference.

BACKGROUND

An electronic computer-aided design ("E-CAD") tool is used to create a circuit design, including a very large scale integration ("VLSI") circuit design. The circuit design includes a netlist, which defines a collection of nets specific to the circuit design. Each "net" is a single electrical path in a circuit that has the same electrical characteristics at all of its points. For example, a collection of wires that carries the same signal between components is a net. If the components allow the signal to pass through unaltered (as in the case of a terminal), then the net continues on subsequently connected wires. If, however, the component modifies the signal (as in the case of a transistor or a logic gate), then the net terminates at that component and a new net begins on the other side. A "net name" identifies a particular net within the netlist. Components are identified within the circuit design as 'design elements'.

A significant characteristic of VLSI and other types of circuit design is a reliance on hierarchical description. A primary reason for using hierarchical description is to hide the vast amount of detail in a design. By reducing the distracting detail to a single object that is lower in the hierarchy, one can greatly simplify many E-CAD operations. For example, simulation, verification, design-rule checking, and layout constraints can all benefit from hierarchical representation, which makes them more computationally tractable. Since many circuit designs are too complicated to be easily considered in their totality, a complete design is often viewed as a collection of design element aggregates that are further divided into sub-aggregates in a recursive and hierarchical manner. In VLSI circuit designs, these aggregates are commonly referred to as design blocks (or cells). The use of a design block at a given level of hierarchy is called an 'instance'. Each design block has one or more 'ports', each of which provides a connection point between a net within the design block and a net external to the design block. A net connected to a port in a design block is termed a 'ported' net.

A Highest Level Signal Name ("HLSN") is the unique signal name that identifies a collection of connected nets or 'hierarchical net pieces'. For example, a hierarchical net piece is a ported net in a design block; the ported net connects to a ported net of another design block to form the HLSN. The HLSN derives its identity from the name of the hierarchical net piece at the highest hierarchical level in the circuit design.

Typically, during analysis of a circuit design, an E-CAD analysis tool (e.g., an analysis tool that analyzes a circuit design to estimate field effect transistor ("FET") leakage currents) determines an HLSN for a particular net in the circuit design. Configuration commands and other parameters of the circuit design are often specified using a net's HLSN as a reference. It is therefore important to identify the HLSN for any given net to determine if a particular configuration command is applicable to the net. In one example, the E-CAD analysis tool, during analysis of the circuit design, reaches a transistor terminal (or other device terminal) at one hierarchical level of the circuit design. The HLSN of one or more nets connected to other terminals of the transistor is needed to apply appropriate configuration commands. Further, on completion of the analysis, the analysis results are often reported relative to each HLSN in the circuit design, since such information is often more useful to design engineers than information relating to individual nets of the circuit design.

Prior art E-CAD analysis tools typically generate a 'map' relating each net (by the identifying net name) to its corresponding HLSN. Where the circuit design comprises billions of components, this mapping process takes a significant amount of time and consumes a substantial amount of memory. Thus, the design process is delayed and computer resources are committed to the map, reducing resource availability to other tools and programs.

SUMMARY

In one embodiment, a method determines a highest level signal name in a hierarchical circuit design. A signal path is traced into a hierarchically lower level of the circuit design from a predetermined net in the circuit design to a predetermined terminal instance, while adding indicia, to an instance history list, of each subsequent instance encountered. A port instance is determined on the terminal instance associated with a selected net for which the highest level signal name is to be determined. The selected net is designated as the current net. For each stored indicia in the instance history list, the net connected to the current net in a hierarchical parent of the instance identified by the indicia is determined, to establish a next current net. If a condition exists wherein there is no connection from the current net to a hierarchically higher level instance, then the current net is established as the highest level signal name for the selected net.

In another embodiment, a method determines a highest level signal name (HLSN) for a selected net in a hierarchical circuit design. A signal path is traced from a net in an instance in the design to a terminal instance in a hierarchically lower level of the design. Indicia of each instance encountered is stored in an instance history list. The steps of tracing and storing are repeated until a predetermined trace endpoint is encountered. A selected port instance for which the HLSN is to be determined is determined for the selected terminal instance. A current net is determined on the selected port instance. The port connected to the current net is determined. The most recently stored indicia is removed from the instance history list. The port instance on the instance identified by the most recently stored indicia, which is an instantiation of the port connected to the current net, is determined as a next port instance. The net connected to the next port instance is determined as the current net. The previous four steps are repeated until a retrace endpoint is encountered to establish the current net as the HLSN for the selected port instance.

In another embodiment, a method determines a highest level signal name (HLSN) for a selected net in a hierarchical circuit design. A first port instance on an initial net is selected. A trace operation: determines the owning instance for the first port instance; stores indicia of the owning instance, as a stored instance, in an instance history list; determines a next net connected to the port on the describing block of the owning instance; uses the next net as the initial net for a next iteration of the trace operation; and selects a new first port instance on the initial net. The trace operation repeats if the owning instance is not a predetermined trace endpoint. A selected port instance is determined for which the HLSN is to be determined. A current net on the selected port instance is determined. A retrace operation then: determines the port connected to the current net; removes, from the instance history list, the most recently stored indicia; determines, as a next port instance, the port instance on the instance identified by the most recently stored indicia that is an instantiation of the port connected to the current net; and determines, as the current net, the net connected to the next port instance. The retrace operation repeats until a retrace endpoint is encountered.

In another embodiment, a system determines a highest level signal name (HLSN) for a selected net in a hierarchical circuit design. A processor is coupled to a storage unit containing the hierarchical circuit design, and to computer memory. An instance history list is stored in the computer memory. A path trace module, stored in the computer memory, is executed by the processor to analyze the hierarchical circuit design to determine the HLSN for the selected net. Through the path trace module, a signal path is traced into a hierarchically lower level of circuit design from a predetermined net in the design to a predetermined terminal instance, while adding indicia, to the instance history list, of each subsequent instance encountered during the tracing; a port instance associated with the selected net for which the HLSN is to be determined is determined; the selected net is designated as the current net; for each stored indicia in the instance history list, the net connected to the current net in a hierarchical parent of the instance identified by the indicia is determined to establish a next current net; if a condition exists wherein there is no connection from the current net to a hierarchically higher level instance, the current net is established as the highest level signal name for the selected net.

In another embodiment, a system determines a highest level signal name in a hierarchical circuit design, including: means for tracing a signal path from a net in an instance in the circuit design to a terminal instance in a hierarchically lower level of the design; means for storing, in an instance history list, indicia of each instance encountered by the means for tracing, wherein the tracing and storing operations are repeated until a predetermined trace endpoint is encountered; means for establishing a current port instance, within the terminal instance, for which the HLSN is to be determined, and for designating, as the current net, the selected net; and means for performing a retrace operation, including: means for determining the net connected to the current net in a hierarchical parent of the instance identified by the indicia, to establish a next current net; and means for establishing the current net as the highest level signal name for the selected net. The means for performing a retrace operation is performed for each stored indicia in the instance history list until a retrace endpoint is encountered.

In another embodiment, a software product includes instructions, stored on computer-readable media, wherein the instructions, when executed by a computer, perform steps for determining a highest level signal name in a hierarchical circuit design, including: instructions for tracing a signal path into a hierarchically lower level of circuit design from a predetermined net in the circuit design to a predetermined terminal instance, while adding indicia, to an instance history list, of each subsequent instance encountered during tracing; instructions for determining a port instance associated with a selected net for which the highest level signal name is to be determined; instructions for determining a port instance associated with the selected net for which the highest level signal name is to be determined; instructions for designating, as the current net, the selected net; and, for each stored indicia in the instance history list: instructions for determining a current net on the current port instance; and instructions for determining a next current port instance on the last instance that is an instantiation of the port connected to the current net; and if a condition exists wherein there is no connection from the current net to a hierarchically higher level instance, then instructions for establishing the current net as the highest level signal name for the selected net.

BRIEF DESCRIPTION OF THE DRAWINGS

FIG. 5 is a flowchart illustrating one process for determining a highest level signal name for a selected net in a hierarchical circuit design.

DETAILED DESCRIPTION

Figure 1:
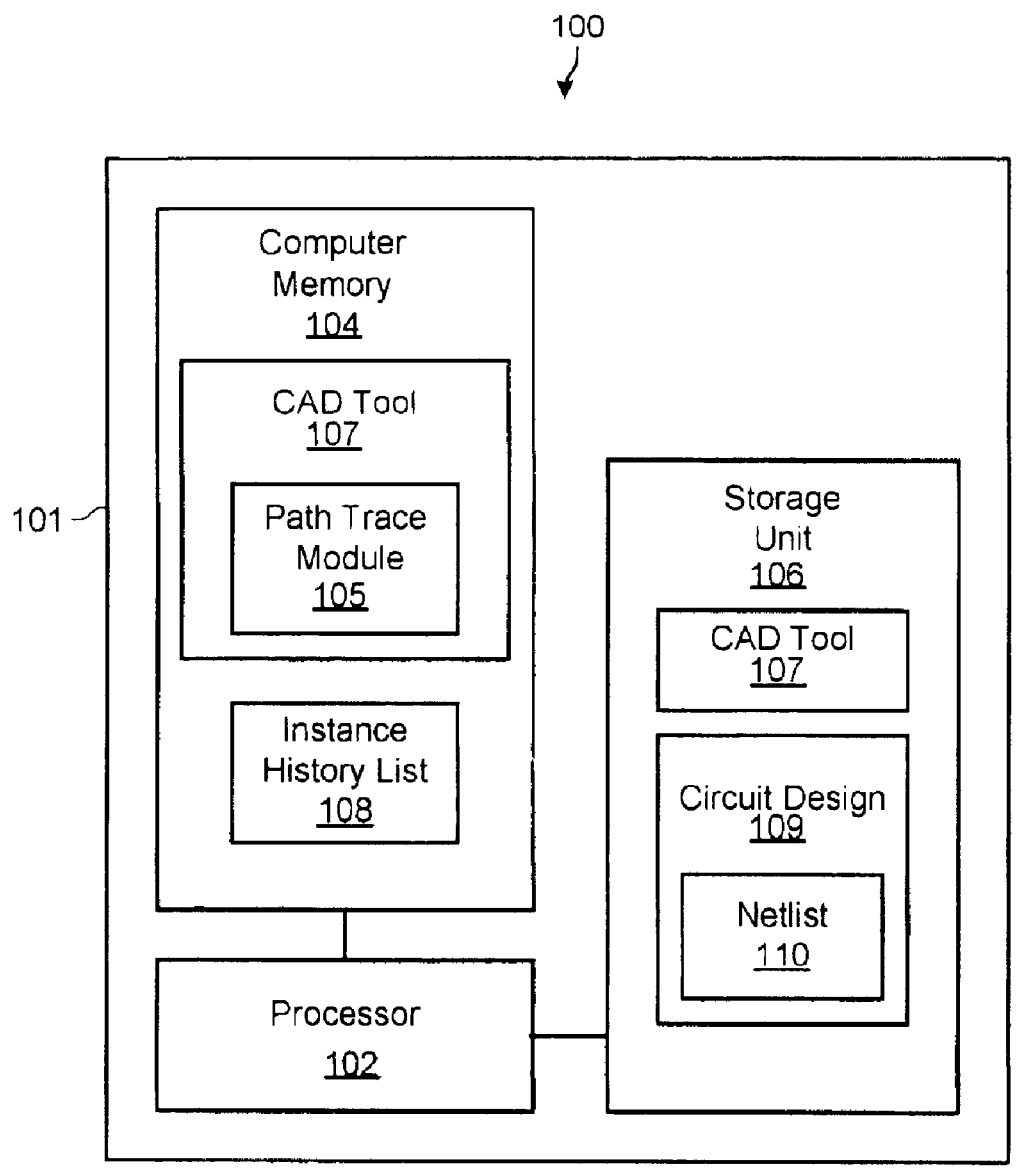
FIG. 1 shows one CAD system for determining a highest level signal name in a hierarchical VLSI design.

FIG. 1 shows an exemplary embodiment of computer-aided design ("CAD") system 100 configured for traversing hierarchically linked design elements of a circuit design 109, to determine a highest-level signal name ("HLSN") relative to a particular net in circuit design 109. CAD system 100 includes a computer system 101 and a CAD tool 107. CAD tool 107 is, for example, an electronic CAD ("E-CAD") tool suitable for analyzing VLSI circuit designs. As shown in FIG. 1, computer system 101 controls CAD tool 107 to analyze circuit design 109. Circuit design 109 is, for example, a hierarchical VLSI circuit design. Computer system 101 includes processor 102, computer memory 104, and storage unit 106; processor 102 is coupled to computer memory 104 and to storage unit 106. In one embodiment, CAD tool 107 initially resides in storage unit 106 as software instructions. Upon initialization, CAD tool 107 is loaded into computer memory 104. At least a part of design 109, including a netlist 110 of circuit design 109, may also be loaded into computer memory 104 upon initialization of CAD tool 107. Processor 102 then executes a signal path tracing sub-tool within CAD tool 107 to determine one or more HLSNs in a section of design 109, as described below.

In an exemplary embodiment, path trace module 105 (which may be a sub-tool of CAD tool 107) is configured for storing indicia of block instances in circuit design 109 that are encountered as a particular hierarchical connection is traced to lower levels of hierarchy. More specifically, as a signal is traced from net to net through associated ports and port instances (explained below), a pointer to an object that represents the instance of interest is added to an instance history list 108. Instance history list 108 operates as a last in first out type storage device (stack) and contains pointers to instances of blocks (hereinafter simply 'instances') that have been traced 'into' while following the hierarchical connection. Instance history list 108 is then used to retrace the hierarchical connection to higher levels of the hierarchy. The HLSN of any net reached during the trace can be found by removing the last instance pointer from instance history list 108, determining an associated port instance, and repeating the process for a net connected to that port instance until an endpoint is encountered.

Figure 2:
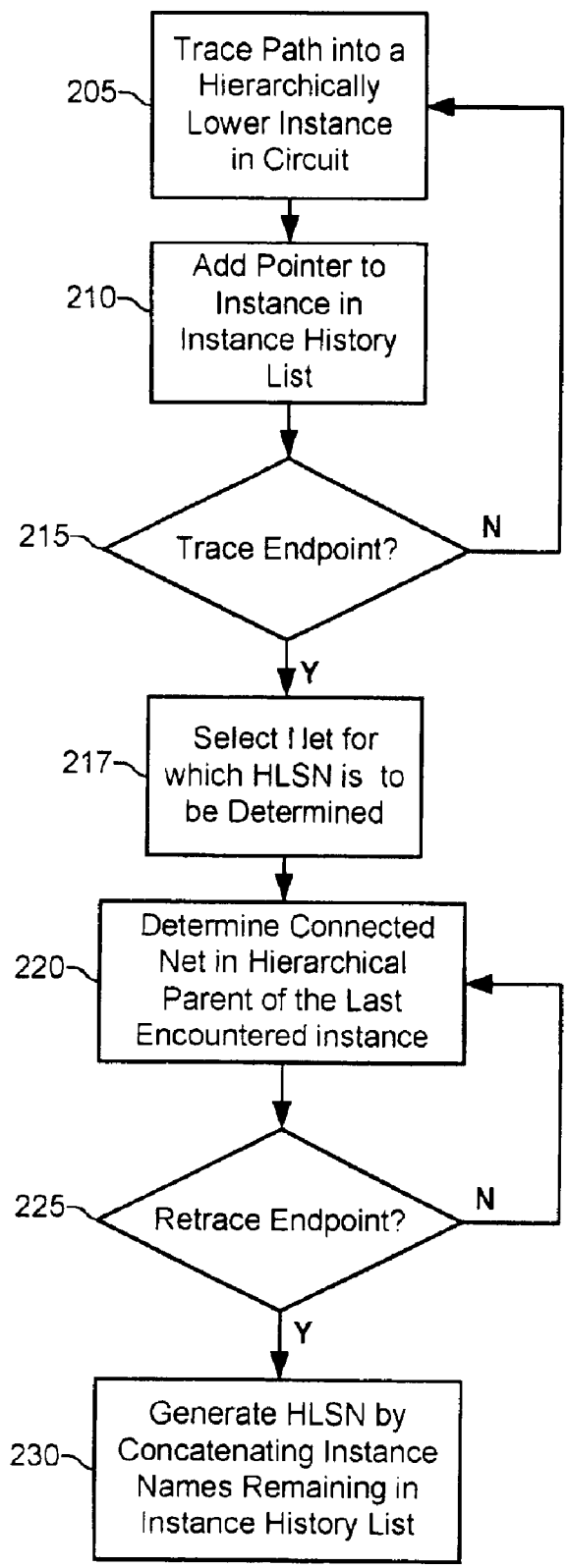
FIG. 2 is a flowchart illustrating a set of exemplary steps performed during operation of the system of FIG. 1.
Figure 3:
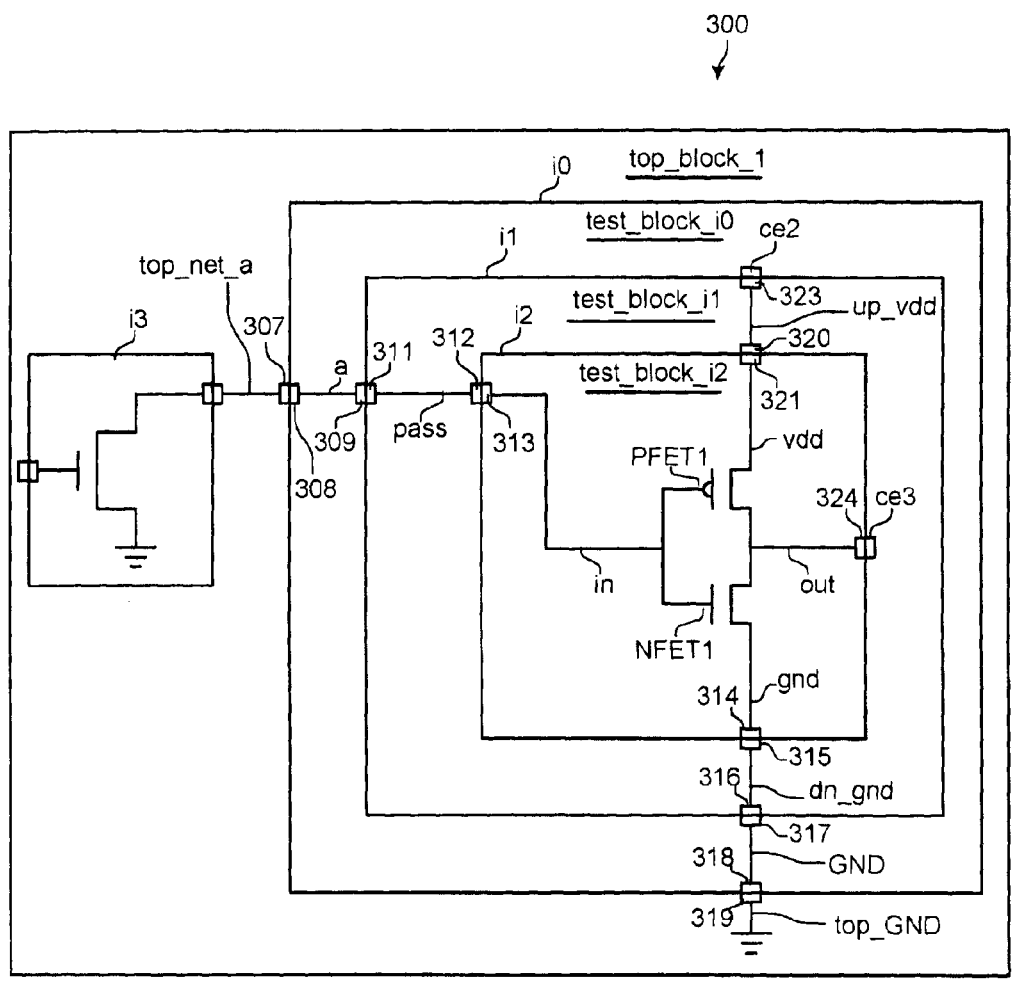
FIG. 3 shows an exemplary design to be analyzed by the method shown in FIG. 2.

FIG. 2 is a flowchart illustrating one set of exemplary steps performed during operation of system 100 of FIG. 1. FIG. 3 shows one exemplary circuit design 300 that may be analyzed by the method shown in FIG. 2. Operation of system 100 is best understood by viewing FIGS. 2 and 3 in conjunction with one another.

Circuit design 109 may be considered as a collection of component aggregates that are further divided into sub-aggregates in a recursive and hierarchical manner. In VLSI circuit design, these aggregates are commonly referred to as blocks or cells. The use of a block at a given level of hierarchy is called an 'instance'. Each block has one or more 'ports', each of which provides a connection point between a net within the block and a net external to the block. The terms 'block', 'instance', 'port', and 'port instance' may be explained as follows, using circuit design 300 in FIG. 3 as a reference. As shown in FIG. 3, circuit 300 includes block instances i0, i1, i2, and i3. Instances i0 and i1 are hierarchically connected by nets 'a' and GND. Instances i1 and i2 are hierarchically connected by nets 'pass', 'up_vdd', and 'dn_gnd'. Instance i1, when viewed from the perspective of a top level in the sub-hierarchy represented by test_block_i1 and test_block_i2, is itself considered to be a block, i.e., test_block_i1, in that particular hierarchical context. In the same context, the block test_block_i1 contains instance i2, which, if considered from a perspective internal to the 'box' (i2/test_block_i2) shown in FIG. 3, would be referred to as block test_block_i2.

It can thus be seen that the definitions of 'block' and block 'instance' respectively depend on whether a particular 'box' (a block or instance of the block) is viewed from an internal or external standpoint, i.e., the appropriate nomenclature depends on the hierarchical perspective from which the 'box' is viewed. Each 'box' (block or instance) has a plurality of 'ports' and corresponding port instances ('portinsts'), each pair of which provides a connection point between a net within the block and a net external to the block. A 'port/portinst' thus comprises two contiguous parts, a first part, termed a 'portinst', which is a port instance located externally on a box (or instance) boundary; and a second part, termed a 'port', which is located internally on the box (or block) boundary.

As can be seen from FIG. 3, portinsts are the half of the 'port/portinst' on the outside of a 'box' (for example, item 312), and ports are the half of the 'port/portinst' on the inside of a 'box' (e.g., item 313). A port takes the same name as the net to which it is connected, and port instances have the same name as their describing port (i.e., the same name as the net in the describing block). When examining a netlist, such as netlist 110, portinst 312 in design 300 may be described in the netlist as 'net pass≧port inst in' in the block test_block_i1. This netlist entry indicates that the net 'pass' connects to the portinst 'in' 312 on instance 'i2.' The corresponding port in test_block_i2 is port 313, which has the name 'in', since it is connected to net 'in' in test_block_i2. In an exemplary embodiment, a hierarchical model stored as part of circuit design 109 is used to represent the hierarchy of design 300, and the difference between a portinst and a port is readily determined through the use of object-oriented techniques in which port and portinst are different objects and are owned by different types of objects.

As shown in FIG. 2, initially, at step 205, path trace module 105 traces a connection (a signal path) into a hierarchically lower level of circuit design 109 from a predetermined starting point, which may be any desired net in the design. At step 210, as path trace module 105 encounters each new instance, a pointer to the instance (an 'instance pointer') is added to instance history list 108. More specifically, steps 205 and 210 can be described as follows. The trace starts at a predetermined HLSN or other initial net. The owning instance for the port instance on this net is then determined. If the owning instance is not a predetermined trace endpoint, the owning instance is pushed onto the instance history list 108. The net connected to the port on the describing block of the instance (i.e., the net connected to the port within the instance) is then determined, and used as the initial net for the next iteration of the path trace process.

At step 215, if path trace module 105 encounters an initial endpoint of the trace (i.e., a predetermined termination point of a particular net), then processing continues at step 217; otherwise, steps 205 and 210 are repeated for nets connected to one or more successively hierarchically lower levels of circuit design 109, until a predetermined trace endpoint is reached. The trace endpoint is a selected terminating instance, or 'terminal instance', which may connect a net or nets for which the HLSN needs to be determined. This net may be connected to a terminal of a device, such as a transistor, for which the HLSN of one of the other terminals of that device is desired.

Once path trace module 105 has traced a signal path to the selected trace endpoint, the HLSN of any net within the block being analyzed may then be determined by performing the following reverse-trace (retrace) procedure. First, a port instance (associated with a selected net) is selected for which the HLSN is to be determined, at step 217. Next, the last instance pointer stored in instance history list 108 is 'popped' (removed) from instance history list 108, at step 220, by path trace module 105, to determine the net connected to the current net in the hierarchical parent of the last (most recently) encountered instance. More specifically, step 220 can be described as follows. Determine the current net on the selected port instance. Then determine the port connected to the current net. Next, pop the last instance off instance history list 108. Next, determine the associated port instance on this last instance that is an instantiation of (i.e., contiguous to) the port connected to the current net. Finally, determine the net connected to the port instance. The process of determining the associated port instance, and repeating the process for the net connected to that port instance is continued until a retrace endpoint is encountered, as explained with respect to step 225.

At step 225, a check is made to determine whether a retrace endpoint has been encountered.

An endpoint of the retrace process is encountered when one of the following conditions occurs:
- the instance history list 108 is empty: the top block in the hierarchy has been reached, so the current net is the trace endpoint;
- the current net is not ported outside of a block, i.e., there is no signal path higher in the hierarchy, so the current net is the endpoint;
- there is no net connected to the port instance that is located on the instance within which current net exists. In this situation there is a connectivity error. The present system may nevertheless return the current net as the HLSN net, since this is the highest level net determinable in the hierarchy.

Path trace module 105 then continues to reverse trace, performing steps 220 and 225, until a retrace endpoint has been encountered. At this point, the trace has reached the instance in the hierarchy that contains the HLSN of the net selected in step 217. The HLSN for the selected net (or net 'object', using an object-oriented technique) is then determined from instance history list 108, at step 230, by concatenating, with the current net name, the names of each instance (pointed to) in instance history list 108 to determine the HLSN for the selected net.

Before presenting a specific example showing the operation of the present system, exemplary pseudo code is set forth below to show how the trace and retrace process may be coded to allow execution by a processor such as processor 102. Initially, a recursive function ('recurse') is used to create an instance history list 108 for the selected HLSN:

```
recurse:
  foreach portinst on net {
    get owning instance
    if (is_primitive(owning instance)) {
      ProcessInstance(instance_list, owning instance, portinst)
    }
    push instance onto list
    get port on describing block of instance
    get net connected to port
    GOTO recurse
  }
```

Note that the 'is_primitive' call above can be 'true' for any instance along the hierarchy; this call is a function to determine when an instance selected for processing has been found. Once a selected instance has been located, a processing function, such as ProcessInstance( ), shown below, may be invoked:

```
ProcessInstance(instance_list, owning_instance, portinst) {
  foreach portinst on owning_instance {
    // Get the HLSN net, and unwind the instance_list to the correct level of
    // hierarchy
    copy_of_instance_list = instance_list
    hlsn_net = ReverseTraceHierNet(portinst->GetNet( ),
    copy_of_instance_list)
```

```
    // The HLSN net determined above may now be used, in conjunction
    // with the unwound instance history, to perform some desired analysis:
    hlsn_string = RebuildHierNetName(copy_of_instance_list,
    hlsn_net)
    config_object = GetConfig(hlsn_string)
    DoSomeAnalysisWithConfig( )
  }
}
```

To better understand how the function ReverseTraceHierNet works, exemplary pseudo code for this function is included below:

```
Net *
ReverseTraceHierNet(
  InstPtrList *pInstance_hist,
  Net *pNet)
{
  Port    *pNetPort = NULL;
  bcmInstance *pInstance;
  bcmPortInst *pPortInst;
  // If the InstanceHist is empty, the top block has been reached, and
  // the current net object is returned.
  if (pInstance_hist->empty( )) {
    return pNet;
  }
  pNetPort = pNet->GetPort( );  // If the port is NULL, then the net is
  // not ported, and the current net
  // object is returned.
  if (pNetPort == NULL) {
    return pNet;
  }
```

At this point, the port (the 'port object', using an object-oriented technique) on the current net has been determined. Next, the port instance object on the first instance in the instance history that corresponds to this port is determined:

```
  pInstance = pInstance_hist->front( );
  pInstance_hist->pop_front( );
  pPortInst = pInstance->GetPortInst(pNetPort->GetName( ));
  if (pPortInst->GetNet( ) == NULL) {
    pInstance_hist->push_front(pInstance);
    return pNet;
  }
  return ReverseTraceHierNet(pInstance_hist, pPortInst->GetNet( ));
}
```

Using FIGS. 2 and 3 as a reference, an exemplary signal trace may be performed, starting at the HLSN 'top_GND' in 'top_block_1', and continuing to transistor NFET1 in instance i2. In the present example, therefore, assume that instance 'i2' is selected as the terminating trace instance (the trace endpoint). Therefore, the trace visits the net 'GND' in instance i0, the net 'dn_gnd' in instance i1, and terminates at the net 'gnd' in instance i2.

An exemplary instance history list 108 is generated, by path trace module 105, for the trace starting at the HLSN top_GND, in the following manner:

First Iteration of the Trace Operation:
- For port instance 319 on net top_GND, get the owning instance for the port instance (=instance 'i0').
- Since the instance 'i0' is not a trace endpoint, push the owning instance onto instance history list 108 (list= [i0]).
- Get the port on the describing block (test block i0) of the instance (port=318).
- Get the net connected to the port (=GND).

Second Iteration:
  For port instance 317 on net GND, get the owning instance for the port instance (=i1).
  Since the instance 'i1' is not a trace endpoint, push the owning instance onto instance history list 108 (list now=[i0, i1]).
  Get the port on the describing block of the instance (port=316)
  Get the net connected to the port (net=dn_gnd).
Third Iteration:
  For port instance 315 on net dn_gnd, get the owning instance for the port instance (=i2).
  Since instance i2 is a selected trace endpoint, a retrace function ('ProcessInstance(instance_list', owning_inst, portinst) in the present exemplary embodiment) is called to 'unwind' the instance history list 108 (which is presently [i0, i1]) to the correct level of hierarchy.

The retrace function determines the HLSN for a selected port instance or a selected net associated with a particular port instance. The port instances that are selected for analysis in the present example are port instances 312 and 320 (assuming the path initially traced into the current block is ignored). The signal path is retraced 'up' the hierarchy, thereby arriving at the endpoint HLSNs 'top_net_a', and 'i0/i1/up_vdd', respectively, as explained in detail below.

In the present example, the retrace process starts at instance 'i2', to determine HLSNs connected to the selected instance. The instance history list 108 so far (assuming the initial traverse started with a blank list at 'top_GND') is [i0, i1]. Then, starting at each port instance on instance 'i2', path trace module 105 navigates upward through the hierarchy, for each port instance, in the following manner: Select port instance 312. Next, get the current net on the selected port instance 312 (=net 'pass' in test_block_i1). Then make a copy of the instance history, since the recursive function ('recurse') will change the contents of 'instance_hist'. Copy_inst_hist=[i0, i1]

First Iteration of the Retrace Operation:
  Get the port connected to the current net (=port 311 on net 'pass')
  Pop the last instance off the copy_instance_hist object (=instance 'i1'; copy_instance_hist now=[i0]).
  Get the port instance on 'i1' that is an instantiation of port 311 (=portinst 309).
  Get the net connected to portinst 309 (=net 'a' in test_block_i0).
  This net becomes the 'current net' for the next iteration.
  Recurse('a', copy_instance_hist)
Second Iteration:
  Get the port connected to the current net (=port 308 on net 'a').
  Pop the last instance off the copy_instance_hist_object (=instance 'i0', copy_instance_hist now=[ ]).
  Get the port instance on 'i0' that is an instantiation of port 308 (=portinst 307).
  Get the net connected to portinst 307 (='top_net_a' in top_block_1).
  Recurse('top_net_a', copy_instance_hist)
Third Iteration:
  The current net ('top_net_a') is not ported to a higher hierarchical level, so the current net 'top_net_a' is concatenated with the empty list of instances in the copy of the instance history list 'copy_instance_hist', to generate 'top_net_a' as the HLSN of the starting net 'i0/i1/pass'.

Next, the HLSN for net 'up_vdd' is determined as follows:
  Select port instance 320.
  Get the net on port instance 320 (returns 'up_vdd' in test_block_i1).
  Make a copy of the instance hist, since the recursive function is going to change the contents. Copy_inst_hist=[i0, i1].
First Iteration:
  Get the port connected to this net (=323).
  Pop the last instance off the copy_instance_hist object (returns 'i1', copy_instance_hist now=[i0]).
  Get the port instance on 'i1' that is an instantiation of port 323 (a connectivity error is returned, as indicated by the absence of a connection to port instance ce2).
  Since this net is not connected at the parent (due to the connectivity error), the current net is the HLSN, since this net is the highest level net determinable in the hierarchy.
  Push the instance 'i1' back on the copy_instance_hist object, since the retrace did not proceed past this instance. copy_instance_hist now=[i0, i1].
  The current net, 'up_vdd' net is then concatenated with the list of instances in the copy of the instance history list, to generate 'i0/i1/up_vdd' as the HLSN for net 'up_vdd'.

Figure 4:
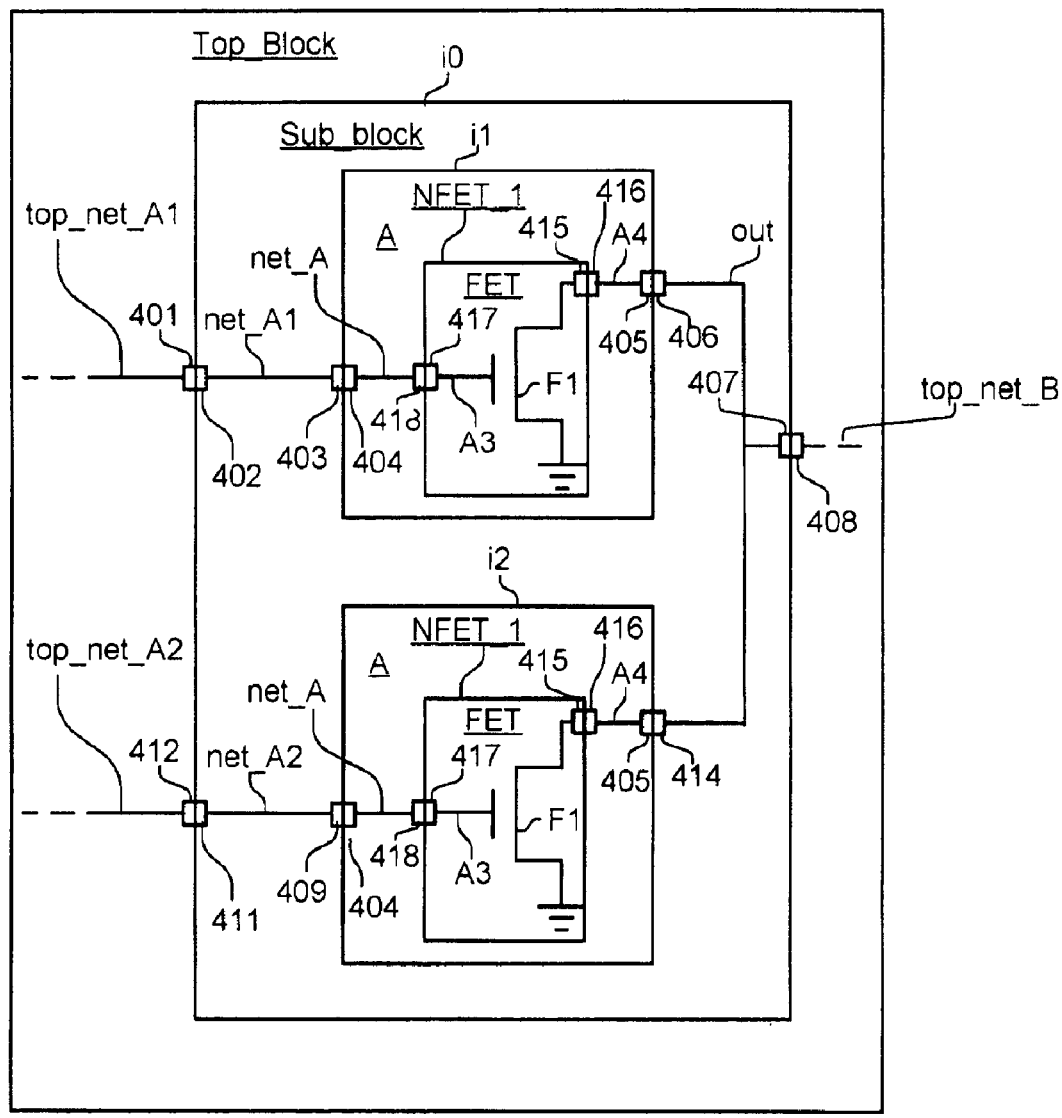
FIG. 4 shows another exemplary design to be analyzed by the method shown in FIG. 2.

FIG. 4 shows another exemplary design to be analyzed by the method shown in FIG. 2. Assume, for the present example, that the trace operation begins at top_net_B in FIG. 4, and the desired terminating trace instance (the selected trace endpoint), which may be a net or any other element in a circuit design, is FET 'F1'. Note that there are identical blocks in instances i1 and i2 with the same name, i.e., 'NFET_1'. Thus, there are two trace endpoints with the same name. It can therefore be seen, from the following example, why the trace history is useful to perform the retrace operation.

First Iteration of the Trace Operation:
  For port instance 408 on net_top net_B, get the owning instance for the port instance (=instance 'i0').
  Since the instance 'i0' is not a trace endpoint, push the owning instance onto the instance history list (list=[i0]).
  Get the port on the describing block ('Sub_block') of the instance (port=407).
  Get the net connected to the port (='out').
Second Iteration:
  Since there are two portinsts connected to net 'out' (406 and 414), a 'sub-iteration' also needs to be performed for the second portinst 414 on the current net, assuming that all connections in the circuit design of FIG. 4 are to be traced. However, for the sake of simplicity, the present example illustrates the trace through portinst 406 only. In either event, the trace will encounter a FET 'F1'.
  For port instance 406 on net 'out', get the owning instance for the port instance (=i1)
  Since the instance 'i1' is not a trace endpoint, push the owning instance onto the instance history list (list now=[i0, i1])
  Get the port on the describing block of the instance (port=405)
  Get the net connected to the port (net='A4')
  For port instance 416 on net 'A4', get the owning instance for the port instance (=NFET_1).

Get the port on the describing block of the instance (port=415).

Get the net connected to the port.

At this point, FET 'F1', is encountered. Since FET 'F1' is the selected trace endpoint, the retrace function ('ProcessInstance (instance_list', owning_inst, portinst) is called to 'unwind' the instance history list 108 to the correct level of hierarchy to determine the HLSN for the selected net. In the present example, assume that the retrace process is started at 'i0/i1/net_A', to determine the HLSN connected to this selected net. The current net is thus 'i0/i1/net_A', but note that there are two instantiations of the present block (NFET_1), therefore, the specific port instance to use for the retrace must first be determined. The appropriate port instance connected to 'i0/i1/net_A' cannot be determined unless the particular instantiation of the port on the net is known, in order to be able to find the net at the next level of hierarchy. Therefore, the specific instantiation of 'net_A' must be determined to enable tracing out of the correct instantiation. In the present case, since net 'A' is selected as the retrace starting point, the corresponding port instance (i.e., the port instance that is an instantiation of the port connected to the current net 'A') must be determined. The first iteration of the retrace operation (below) shows that reference to the instance history enables the retrace to start with net_A1 instead of net_A2.

The instance history list 108 so far is [i0, i1]; therefore, the copy of the instance history (Copy_inst_hist)=[i0, i1].

First Iteration of the Retrace Operation:
  First, get the port connected to the selected net, 'net_A' (=port 404). Note that the corresponding port in instance 'i2'(as well as all of the other port and portinst names in i2) have the same name as the corresponding port in instance 'i1', because these instances are two instantiations of the same block, NFET1.
  Pop the last instance off the copy_instance_hist object (=instance 'i0'; copy_instance_hist now=[i1]).
  Get the port instance on 'i1' that is an instantiation of port 404 (=portinst 403).
  Get the net connected to portinst 403 (=net 'net_A1' in 'Sub_Block'). This net becomes the 'current net' for the next iteration.
  Recurse('net_A1', copy_instance_hist)
Second Iteration:
  Get the port connected to the selected net, 'net_A1' (=port 402).
  Pop the last instance off the copy_instance_hist object (=instance 'i0'; copy_instance_hist now=[ ]).
  Get the port instance on 'i1' that is an instantiation of port 402 (=portinst 401).
  Get the net connected to portinst 401 (=net 'top_net_A1' in 'Top_Block'). This net becomes the 'current net' for the next iteration.
  Recurse('top_net_A1', copy_instance_hist)
Third Iteration:
  The current net ('top_net_A1') is not ported to a higher hierarchical level, so the current net 'top_net_A1' is concatenated with the empty list of instances in the copy of the instance history list, to generate 'top_net_A1' as the HLSN of the starting net 'i0/i1/net_A'.

FIG. 5 is a flowchart illustrating one process 500 for determining a highest level signal name in a hierarchical circuit design. In step 502, a signal path is traced into a hierarchically lower level of the circuit design from a predetermined net in the circuit design to a predetermined terminal instance. Indicia are added to an instance history list for each subsequent instance encountered in step 502. In step 504, a port instance is determined on the terminal instance associated with a selected net for which the highest level signal name is to be determined. In step 506, the selected net is designated as the current net. In step 508, the net connected to the current net in a hierarchical parent of the instance identified by the indicia is determined, to establish a next current net. In step 510, if a condition exists wherein there is no connection from the current net to a hierarchically higher level instance, the current net is established as the highest level signal name for the selected net.

Instructions that perform the operations of FIG. 2 and/or FIG. 5 may be stored on computer-readable storage media. These instructions may be retrieved and executed by a processor, such as processor 102 of FIG. 1, to direct the processor to operate in accordance with the present system. The instructions may also be stored in firmware. Examples of storage media include memory devices, tapes, disks, integrated circuits, and servers.

Certain changes may be made in the above methods and systems without departing from the scope of the present system. It is to be noted that all matter contained in the above description or shown in the accompanying drawings is to be interpreted as illustrative and not in a limiting sense. For example, the items shown in FIG. 1 may be constructed, connected, arranged, and/or combined in other configurations, and the set of steps illustrated in FIG. 2 and/or FIG. 5 may be performed in a different order than shown without departing from the spirit hereof.

What is claimed is:

1. A method for determining a highest level signal name in a hierarchical circuit design, comprising:
  tracing a signal path into a hierarchically lower level of the circuit design from a predetermined net in the circuit design to a predetermined terminal instance, while adding indicia, to an instance history list, of each subsequent instance encountered in the tracing step;
  determining a port instance on the terminal instance associated with a selected net for which the highest level signal name is to be determined;
  designating, as the current net, the selected net, and
  for each stored indicia in the instance history list:
    determining the net connected to the current net in a hierarchical parent of the instance identified by the indicia, to establish a next current net; and
    if a condition exists wherein there is no connection from the current net to a hierarchically higher level instance, then establishing the current net as the highest level signal name for the selected net.

2. The method of claim 1, wherein the current net is established as the HLSN for the selected net if there is no net connected to the port instance that is located on the instance within which the current net exists.

3. A method for determining a highest level signal name (HLSN) for a selected net in a hierarchical circuit design, comprising:
  tracing a signal path from a net in an instance in the design to a terminal instance in a hierarchically lower level of the design;
  storing, in an instance history list, indicia of each instance encountered during the tracing step;
  repeating the steps of tracing and storing until a predetermined trace endpoint is encountered;
  determining, for the selected terminal instance, a selected port instance for which the HLSN is to be determined;

determining a current net on the selected port instance;
determining the port connected to the current net;
removing, from the instance history list, the most recently stored indicia;
determining, as a next port instance, the port instance on the instance identified by the most recently stored indicia that is an instantiation of the port connected to the current net;
determining, as the current net, the net connected to the next port instance; and
repeating the previous four steps until a retrace endpoint is encountered to establish the current net as the HLSN for the selected port instance.

4. The method of claim 3, wherein the retrace endpoint is encountered when the instance history list is empty.

5. The method of claim 3, wherein the retrace endpoint is encountered when there is no connection from the current net to a hierarchically higher level instance.

6. The method of claim 3, wherein the retrace endpoint is encountered when there is no net connected to the port instance that is located on the instance within which the current net exists.

7. The method of claim 3, further comprising generating the HLSN for the selected net by concatenating, with the name of the current net, the names of each instance indicated in the instance history list.

8. A method for determining a highest level signal name (HLSN) for a selected net in a hierarchical circuit design comprising:
selecting a first port instance on an initial net;
performing a trace operation comprising the steps of:
determining the owning instance for the first port instance;
storing indicia of the owning instance, as a stored instance, in an instance history list;
determining a next net connected to the port on the describing block of the owning instance;
using the next net as the initial net for a next iteration of the trace operation; and
selecting a new first port instance on the initial net;
repeating the trace operation if the owning instance is not a predetermined trace endpoint;
determining a selected port instance for which the HLSN is to be determined;
determining a current net on the selected port instance; and
performing a retrace operation comprising the steps of:
determining the port connected to the current net;
removing, from the instance history list, the most recently stored indicia;
determining, as a next port instance, the port instance on the instance identified by the most recently stored indicia that is an instantiation of the port connected to the current net;
determining, as the current net, the net connected to the next port instance; and
repeating the retrace operation until a retrace endpoint is encountered
wherein:
the instance history list is empty;
there is no connection from the current net to a hierarchically higher level instance; or
there is no net connected to the port instance that is located on the instance within which the current net exists;
and
establishing the current net as the HLSN for the selected net.

9. The method of claim 8, further comprising generating the HLSN for the selected net by concatenating, with the name of the current net, the names of each instance indicated in the instance history list.

10. A system for determining a highest level signal name (HLSN) for a selected net in a hierarchical circuit design, comprising:
a processor, coupled to a storage unit containing the hierarchical circuit design, and to computer memory;
an instance history list stored in the computer memory;
a path trace module, stored in the computer memory, executable by the processor to analyze the hierarchical circuit design to determine the HLSN for the selected net by:
tracing signal path into a hierarchically lower level of circuit design from a predetermined net in the design to a predetermined terminal instance, while adding indicia, to the instance history list, of each subsequent instance encountered during the tracing;
determining a port instance associated with the selected net for which the HLSN is to be determined;
designating, as the current net, the selected net, and
for each stored indicia in the instance history list:
determining the net connected to the current net in a hierarchical parent of the instance identified by the indicia, to establish a next current net; and
if a condition exists wherein there is no connection from the current net to a hierarchically higher level instance, then establishing the current net as the highest level signal name for the selected net.

11. The system of claim 10, wherein the current net is established as the HLSN for the selected net if there is no net connected to the port instance that is located on the instance within which the current net exists.

12. A system for determining a highest level signal name (HLSN) for a selected net in a hierarchical circuit design, comprising:
means for tracing a signal path from a net in an instance in the circuit design to a terminal instance in a hierarchically lower level of the design;
means for storing, in an instance history list, indicia of each instance encountered by the means for tracing;
wherein the tracing and storing operations are repeated until a predetermined trace endpoint is encountered;
means for establishing a current port instance, within the terminal instance, for which the HLSN is to be determined, and for designating, as the current net, the selected net; and
means for performing a retrace operation comprising:
determining the net connected to the current net in a hierarchical parent of the instance identified by the indicia, to establish a next current net; and
establishing the current net as the HLSN for the selected net;
wherein the retrace operation is performed for each stored indicia in the instance history list until a retrace endpoint is encountered.

13. The system of claim 12, wherein the retrace endpoint is encountered when the instance history list is empty, or if a condition exists wherein there is no connection from the current net to a hierarchically higher level instance.

14. A software product comprising instructions, stored on computer-readable media, wherein the instructions, when executed by a computer, perform steps for determining a highest level signal name in a hierarchical circuit design, comprising:

instructions for tracing a signal path into a hierarchically lower level of circuit design from a predetermined net in the circuit design to a predetermined terminal instance, while adding indicia, to an instance history list, of each subsequent instance encountered during tracing;

instructions for determining a port instance associated with a selected net for which the highest level signal name is to be determined;

instructions for designating, as the current net, the selected net; and for each stored indicia in the instance history list:
  instructions for determining a current net on the current port instance; and
  instructions for determining a next current port instance on the last instance that is an instantiation of the port connected to the current net; and
  if a condition exists wherein there is no connection from the current net to a hierarchically higher level instance, then instructions for establishing the current net as the highest level signal name for the selected net.

15. The software product of claim 14, wherein the current net is established as the HLSN for the selected net if there is no net connected to the port instance that is located on the instance within which the current net exists.

* * * * *